(12) United States Patent
Brar et al.

(10) Patent No.: US 7,439,556 B2
(45) Date of Patent: *Oct. 21, 2008

(54) SUBSTRATE DRIVEN FIELD-EFFECT TRANSISTOR

(75) Inventors: Berinder P. S. Brar, Newbury Park, CA (US); Peter M. Asbeck, San Diego, CA (US)

(73) Assignee: ColdWatt, Inc., Austin, TX (US)

( * ) Notice: Subject to any disclaimer, the term of this patent is extended or adjusted under 35 U.S.C. 154(b) by 160 days.

This patent is subject to a terminal disclaimer.

(21) Appl. No.: 11/093,592

(22) Filed: Mar. 29, 2005

(65) Prior Publication Data

US 2006/0226477 A1  Oct. 12, 2006

(51) Int. Cl.
H01L 31/0328 (2006.01)

(52) U.S. Cl. .................................................. 257/194

(58) Field of Classification Search ................ 257/192, 257/194

See application file for complete search history.

(56) References Cited

U.S. PATENT DOCUMENTS

| | | | |
|---|---|---|---|
| 4,499,481 A | 2/1985 | Greene | |
| 4,570,174 A | 2/1986 | Huang et al. | |
| 4,636,823 A | 1/1987 | Margalit et al. | |
| 4,807,022 A | 2/1989 | Kazior et al. | |
| 4,903,089 A | 2/1990 | Hollis et al. | |
| 4,967,243 A | 10/1990 | Baliga et al. | |
| 5,068,756 A | 11/1991 | Morris et al. | |
| 5,106,778 A | 4/1992 | Hollis et al. | |
| 5,126,701 A * | 6/1992 | Adlerstein ................. | 333/17.2 |
| 5,126,714 A | 6/1992 | Johnson | |
| 5,223,449 A | 6/1993 | Morris et al. | |
| 5,231,037 A | 7/1993 | Yuan et al. | |
| 5,244,829 A | 9/1993 | Kim | |
| 5,292,686 A * | 3/1994 | Riley et al. .................. | 438/605 |
| 5,342,795 A | 8/1994 | Yuan et al. | |
| 5,343,071 A * | 8/1994 | Kazior et al. ............... | 257/621 |
| 5,369,042 A | 11/1994 | Morris et al. | |
| 5,374,887 A | 12/1994 | Drobnik | |
| 5,407,842 A | 4/1995 | Morris et al. | |

(Continued)

FOREIGN PATENT DOCUMENTS

EP  1 256 985 A2  11/2002

(Continued)

OTHER PUBLICATIONS

Eisenbeiser, K., et al., "Manufacturable GaAs VFET for Power Switching Applications," IEEE Electron Device Letters, Apr. 2000, pp. 144-145, vol. 21, No. 4, IEEE.

(Continued)

*Primary Examiner*—Thomas L Dickey
(74) *Attorney, Agent, or Firm*—Slater & Matsil, L.L.P.

(57) ABSTRACT

A substrate driven field effect transistor (FET) and a method of forming the same. In one embodiment, the substrate driven FET includes a substrate having a source contact covering a substantial portion of a bottom surface thereof and a lateral channel above the substrate. The substrate driven FET also includes a drain contact above the lateral channel. The substrate driven FET still further includes a source interconnect that connects the lateral channel to the substrate operable to provide a low resistance coupling between the source contact and the lateral channel.

20 Claims, 5 Drawing Sheets

U.S. PATENT DOCUMENTS

| | | | |
|---|---|---|---|
| 5,468,661 | A | 11/1995 | Yuan et al. |
| 5,554,561 | A | 9/1996 | Plumton |
| 5,555,494 | A | 9/1996 | Morris |
| 5,610,085 | A | 3/1997 | Yuan et al. |
| 5,624,860 | A | 4/1997 | Plumton et al. |
| 5,700,703 | A | 12/1997 | Huang et al. |
| 5,712,189 | A | 1/1998 | Plumton et al. |
| 5,747,842 | A | 5/1998 | Plumton |
| 5,756,375 | A | 5/1998 | Celii et al. |
| 5,783,984 | A | 7/1998 | Keuneke |
| 5,784,266 | A | 7/1998 | Chen |
| 5,804,943 | A | 9/1998 | Kollman et al. |
| 5,889,298 | A | 3/1999 | Plumton et al. |
| 5,909,110 | A | 6/1999 | Yuan et al. |
| 5,910,665 | A | 6/1999 | Plumton et al. |
| 5,920,475 | A | 7/1999 | Boylan et al. |
| 5,956,245 | A | 9/1999 | Rozman |
| 5,956,578 | A | 9/1999 | Weitzel et al. |
| 6,008,519 | A | 12/1999 | Yuan et al. |
| 6,038,154 | A | 3/2000 | Boylan et al. |
| 6,094,038 | A | 7/2000 | Lethellier |
| 6,097,046 | A | 8/2000 | Plumton |
| 6,156,611 | A | 12/2000 | Lan et al. |
| 6,181,231 | B1 | 1/2001 | Bartilson |
| 6,191,964 | B1 | 2/2001 | Boylan et al. |
| 6,208,535 | B1 | 3/2001 | Parks |
| 6,218,891 | B1 | 4/2001 | Lotfi et al. |
| 6,229,197 | B1 | 5/2001 | Plumton et al. |
| 6,309,918 | B1 | 10/2001 | Huang et al. |
| 6,323,090 | B1 | 11/2001 | Zommer |
| 6,348,848 | B1 | 2/2002 | Herbert |
| 6,362,986 | B1 | 3/2002 | Schultz et al. |
| 6,477,065 | B2 | 11/2002 | Parks |
| 6,483,724 | B1 | 11/2002 | Blair et al. |
| 6,525,603 | B1 | 2/2003 | Morgan |
| 6,549,436 | B1 | 4/2003 | Sun |
| 6,661,276 | B1 | 12/2003 | Chang |
| 6,741,099 | B1 | 5/2004 | Krugly |
| 6,775,159 | B2 | 8/2004 | Webb et al. |
| 6,873,237 | B2 | 3/2005 | Chandrasekaran et al. |
| 6,980,077 | B1 | 12/2005 | Chandrasekaran et al. |
| 7,012,414 | B1 | 3/2006 | Mehrotra et al. |
| 7,046,523 | B2 | 5/2006 | Sun et al. |
| 7,176,662 | B2 | 2/2007 | Chandrasekaran |
| 7,321,283 | B2 | 1/2008 | Mehrotra et al. |
| 2002/0121647 | A1 | 9/2002 | Taylor |
| 2003/0198067 | A1 | 10/2003 | Sun et al. |
| 2005/0024179 | A1 | 2/2005 | Chandrasekaran et al. |
| 2005/0104080 | A1* | 5/2005 | Ichihara et al. ............... 257/98 |
| 2006/0038650 | A1 | 2/2006 | Mehrotra et al. |
| 2006/0118824 | A1 | 6/2006 | Otsuka et al. |
| 2006/0187684 | A1 | 8/2006 | Chandrasekaran et al. |
| 2006/0197510 | A1 | 9/2006 | Chandrasekaran |
| 2006/0198173 | A1 | 9/2006 | Rozman |
| 2006/0208279 | A1 | 9/2006 | Robinson et al. |

FOREIGN PATENT DOCUMENTS

| | | | |
|---|---|---|---|
| EP | 1 638 147 A2 | 3/2006 | |
| WO | WO 2005015642 A1 * | 2/2005 | |

OTHER PUBLICATIONS

Kollman, R., et al., "10 MHz PWM Converters with GaAs VFETs," IEEE Eleventh Annual Applied Power Electronics Conference and Exposition, Mar. 1996, pp. 264-269, vol. 1, IEEE.

Liu, W., "Fundamentals of III-V Devices: HBTs, MESFETs, and HFETs/HEMTs," §5-5: Modulation Doping, 1999, pp. 323-330, John Wiley & Sons, New York, NY.

Nguyen, L.D., et al., "Ultra-High-Speed Modulation-Doped Field-Effect Transistors: A Tutorial Review," Proceedings of the IEEE, Apr. 1992, pp. 494-518, vol. 80, No. 4, IEEE.

Niemela, V.A., et al., "Comparison of GaAs and Silicon Synchronous Rectifiers in a 3.3V Out, 50W DC-DC Converter," 27th Annual, IEEE Power Electronics Specialists Conference, Jun. 1996, pp. 861-867, vol. 1, IEEE.

Plumton, D.L., et al., "A Low On-Resistance High-Current GaAs Power VFET," IEEE Electron Device Letters, Apr. 1995, pp. 142-144, vol. 16, No. 4, IEEE.

Weitzel, C.E., "RF Power Devices for Wireless Communications," 2002, 2002 IEEE MTT-S CDROM, paper TU4B-1, IEEE.

Williams, R., "Modern GaAs Processing Methods," 1990, pp. 66-67, Artech House, Inc., Norwood, MA.

U.S. Appl. No. 11/211,964, filed Aug. 25, 2005, Brar et al.

Berroth, M., et al., "Extreme Low Power 1:4 Demultiplexer Using Double Delta Doped Quantum Well GaAs/AlGaAs Transistors," Japanese Journal of Applied Physics, Extended Abstracts of the 22nd 1990 International Conference on Solid State Devices and Materials, 1990, pp. 75-78, Tokyo, Japan.

Wu, C.S., et al., "Pseudomorphic HEMT Manufacturing Technology for Multifunctional Ka-Band MMIC Applications," IEEE Transactions on Microwave Theory and Techniques, Feb. 1995, pp. 257-265, vol. 43, No. 2, IEEE, New York, US.

Ajit, J.S., "Design of MOS-Gated Bipolar Transistors with Integral Antiparallel Diode," IEEE Electron Device Letters, pp. 344-347, Jul. 1996, vol. 17, No. 7, IEEE, Los Alamitos, CA.

Peppel, M., et al., "Optimized Reverse Diode Operation of Power MOSFETs," 2000 IEEE Industry Applications Conference, Oct. 8, 2000, pp. 2961-2965, vol. 5, IEEE, Los Alamitos, CA.

Storm, D.F., et al., "Reduction of Buffer Layer Conduction Near Plasma-Assisted Molecular-Beam Epitaxy Grown GaN/AlN Interfaces by Beryllium Doping," Applied Physics Letters, Nov. 11, 2002, pp. 3819-3821, vol. 81, No. 20, American Institute of Physics, Melville, NY.

Bergman, J., "Development of Indium Arsenide Quantum Well Electronic Circuits: A Dissertation Presented to the Academic Faculty," http://smartech.gatech.edu/bitstream/1853/5033/1/bergman_joshua_i_200407_phd.pdf, Jul. 2004, 225 pp., Georgia Institute of Technology, Atlanta, GA.

Asano, K., et al., "Novel High Power AlGaAs/GaAs HFET with a Field-Modulating Plate Operated at 35V Drain Voltage," IEDM 98, 1998, pp. 59-62, IEEE, Los Alamitos, CA.

Lan, E., et al., "A Field Plate Device by Self-Aligned Spacer Process," The International Conference of Compound Semiconductor Manufacturing Technology, 2004, pp. 35-38, GaAs Mantech, St. Louis, MO.

Sickmiller, M., "Packaging of Ultrathin Semiconductor Devices Through the ELO Packaging Process," Mat. Res. Soc. Symp. Proc., 2001, pp. 17.3.1-17.3.6, vol. 681E, Materials Research Society, Warrendale, PA.

Tkachenko, Y., et al., "Improved Breakdown Voltage and Hot-Electron Reliability PHEMT for High Efficiency Power Amplifiers," Asia Pacific Microwave Conference (AMPC'99), Nov. 30, 1999, pp. 618-621, vol. 3, IEEE, Los Alamitos, CA.

* cited by examiner

SUBSTRATE DRIVEN FIELD-EFFECT TRANSISTOR

TECHNICAL FIELD

The present invention is directed, in general, to semiconductor devices and, more specifically, to a substrate driven field-effect transistor.

BACKGROUND

A field-effect transistor (also referred to as a "FET") is a conventional semiconductor device employable in switch-mode power supplies for use in data processing and telecommunication systems as well as for other applications that use conditioned power for operation of sensitive electronic circuits. The field-effect transistors have almost universally replaced bipolar transistors previously used for inverters (a type or portion of a power supply) as well as the p-n and Schottky diodes used for rectification. The proliferation of the field-effect transistors has, at least in part, been driven by the need to provide highly efficient power supplies with low dc output voltages such as five volts or less at higher current levels. The broad acceptance of the field-effect transistors for the aforementioned applications is a consequence of the low forward voltage drop and fast switching speed as well as the low power consumption employed to enable or disable conduction thereof. As a result, the use of the field-effect transistors has contributed to compact and efficient power supplies that can be produced at low cost.

As the loads for the power supplies are generally designed with integrated circuits employing shrinking feature sizes for the circuit elements, a need is continually evolving for new designs with lower output voltages (e.g., one volt or less) at higher current levels (e.g., 50 to 100 amperes or more). Present switch-mode power supplies providing input-output circuit isolation (via a transformer) and employing silicon-based field-effect transistors as synchronous rectifiers therein and designed with best current practice are usually operable with switching frequencies only up to several hundred kilohertz ("kHz") due, at least in part, to the slower switching speeds of the silicon-based field-effect transistors. To accommodate continuing developments in integrated circuit technology, however, the power supply switching frequencies above one megahertz ("MHz") are desirable to reduce the size of magnetic devices and the capacitive filtering elements of the power supply without compromising the power conversion efficiency. In accordance therewith, field-effect transistors with previously unrealizable characteristics are not only being requested, but are necessary to satisfy the conditions.

A material of choice for high performance field-effect transistors is a semiconductor with high electron mobility, and wide band gap for high breakdown voltage that is capable of being processed with conventional equipment and methods not substantially different from those already developed for silicon and present generations of compound semiconductors. A particularly desirable material is the compound semiconductor known as gallium arsenide ("GaAs"), which has been used for integrated circuits operable at frequencies well above one gigahertz, and which has been used to produce power field-effect transistors with high performance characteristics. An exemplary performance of gallium arsenide in comparison to other semiconductor materials for high performance field-effect transistors is described in "Fundamentals of III-V Devices" by W. Liu, published by John Wiley and Sons (1999), and "Modern GaAs Processing Methods" by R. Williams, published by Artech House (1990), which are incorporated herein by reference.

Additionally, examples of gallium arsenide field-effect transistors employing a controllable vertical channel between a source and drain thereof are provided in the following references, namely, U.S. Pat. No. 5,889,298 entitled "Vertical JFET Field Effect Transistor," by Plumton, et al., issued on Mar. 30, 1999, U.S. Pat. No. 5,342,795 entitled "Method of Fabricating Power VFET Gate-Refill," by Yuan, et al., issued on Aug. 30, 1994, U.S. Pat. No. 5,468,661 entitled "Method of Making Power VFET Device," by Yuan, et al., issued on Nov. 21, 1995, U.S. Pat. No. 5,610,085 entitled "Method of Making a Vertical FET using Epitaxial Overgrowth," by Yuan, et al., issued on Mar. 11, 1997, and U.S. Pat. No. 5,624,860 entitled "Vertical Field Effect Transistor and Method," by Plumton, et al., issued on Apr. 29, 1997, which are incorporated herein by reference.

Figure 1:
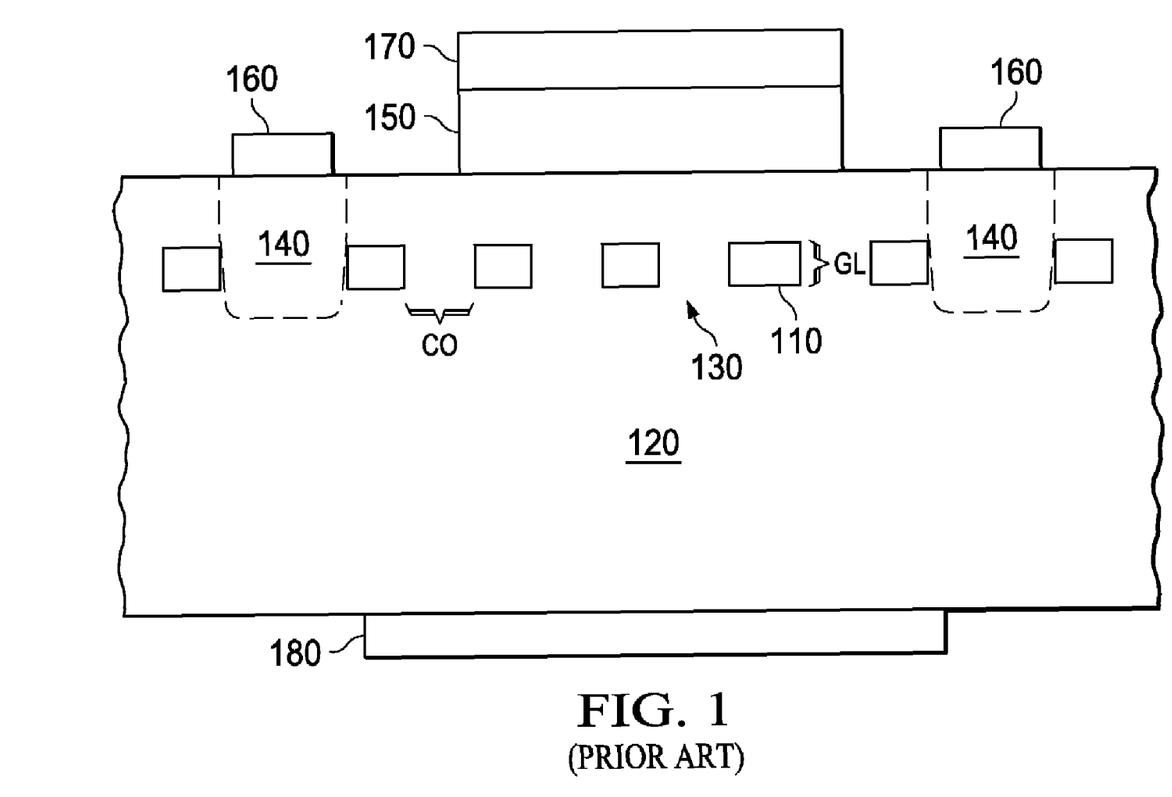
FIGS. 1, 2A and 2B illustrate cross sectional views of field-effect transistors according to the prior art.

An exemplary gallium arsenide field-effect transistor as generally described in the aforementioned references is illustrated with respect to FIG. 1. The gallium arsenide field-effect transistor includes buried and inter-coupled gate fingers (also referred to as a gate and one of which is designated 110) formed in etched trenches in an n-doped drain 120 thereby producing vertical channels 130. The gates 110 exhibit a gate length (generally designated "GL") and the vertical channels 130 provide a channel opening (generally designated "CO"). The trenches are back-filled epitaxially with p-doped gallium arsenide to form the gates 110. A p+ implant 140 provides a top surface contact to the gates 110, and is made through a further n-doped epitaxial layer that forms a source 150. External connection to the gates 110 is made through metallized contacts 160 deposited over the heavily doped p+ implants 140. An external source contact 170 and drain contact 180 are made through metal depositions over further heavily doped areas. The structure produces vertical field-effect transistor channels between the gates 110, and provides source and drain contacts 170, 180, respectively, on opposing sides of the die. The device, therefore, operates with vertical carrier flow and the buried gates 110, typically doped opposite from the vertical channels 130, exhibit limited control over a fill profile thereof.

Thus, the field-effect transistor as described above does not accommodate a careful doping profiling and epitaxial layer design necessary to produce a modulation-doped channel that can be formed in a lateral channel and that may be employed to substantially reduce the on-resistance of the device. The field-effect transistor described above is not configured with a channel having a strained material which significantly improves a mobility of the current carrying carriers and, consequently, a switching speed thereof. This design methodology of constructing such gallium arsenide field-effect transistors has been analyzed in the following references, namely, "Comparison of GaAs and Silicon Synchronous Rectifiers in a 3.3V Out, 50 W DC-DC Converter," by V. A. Niemela, et al., 27th Annual, IEEE Power Electronics Specialists Conference, Vol. 1, June 1996, pp. 861-67, "10 MHz PWM Converters with GaAs VFETs," by R. Kollman, et al., IEEE Eleventh Annual Applied Power Electronics Conference and Exposition, Vol. 1, March 1996, pp. 264-69, "A Low On-Resistance High-Current GaAs Power VFET," by D. L. Plumton, et al., IEEE Electron Device Letters, Vol. 16, Issue 4, April 1995, pp. 142-44, and "RF Power Devices for Wireless Communications", by C. E. Weitzel, IEEE MTT-S2002, paper TU4B-1, which are incorporated herein by reference. The structure as generally described in the aforementioned references has higher channel and gate resistance per unit die area than the desired resistance. The resulting cost and performance have resulted in limited marketability in view of the presently available silicon-based technology.

Another example of a vertical channel gallium arsenide field-effect transistor is described in "Manufacturable GaAs VFET for Power Switching Applications," by K. Eisenbeiser, et al., IEEE Electron Device Letters, Vol. 21, No. 4, pp. 144-45 (April 2000), which is incorporated herein by reference. The reference describes forming a source contact on a top surface of the die and a drain contact on the bottom. A vertical channel, however, is still provided in the design proposed by Eisenbeiser, et al. Although economies of manufacture are achieved using implants rather than etching and epitaxial growth as described by Eisenbeiser, et al., the possible disadvantages of a channel with a vertical structure limit the switching speed and operation as an enhancement-mode device.

Figure 2A:
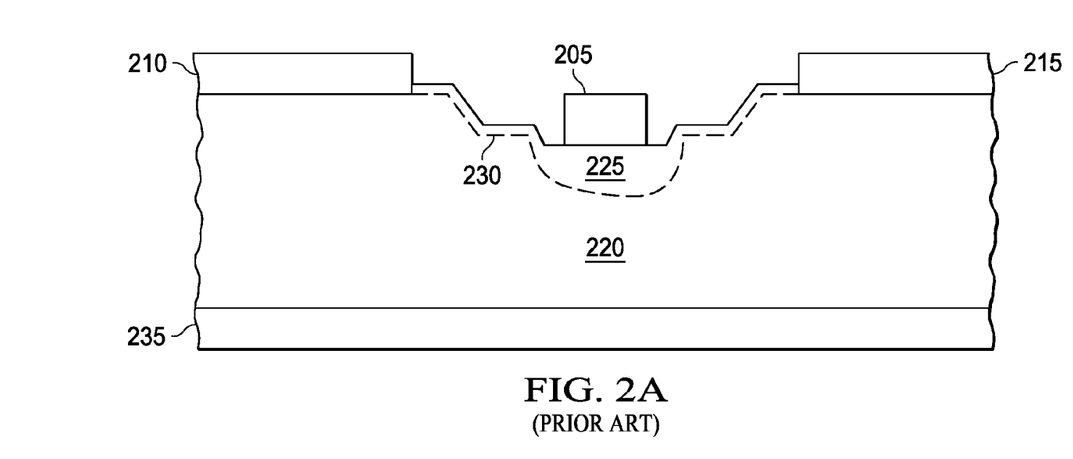

R. Williams describes a GaAs power field-effect transistor in "Modern GaAs Processing Methods," incorporating both the source and drain contacts on the upper side of a die with a lateral channel and is illustrated with respect to FIG. 2A. The gallium arsenide field-effect transistor acting as a power field-effect transistor includes a gate 205 interposed between a source 210 and drain 215, creating a lateral channel in an n-doped GaAs layer 220. A depletion region 225 is formed under the gate 205 and a shallower depletion region 230 forms generally under an upper surface of the die as a result of an inherent existence of surface states at the surface of the crystal (i.e., a surface pinning effect). The gallium arsenide field-effect transistor is formed over a semi-insulating GaAs substrate 235. Designing the source and drain contacts on the same surface of the die requires a complicated multilayer metallization process and results in increased die area and reduced chip yield. The aforementioned configuration can also lead to increased inductance, which is of significance in applications for microwave signal amplification.

Figure 2B:
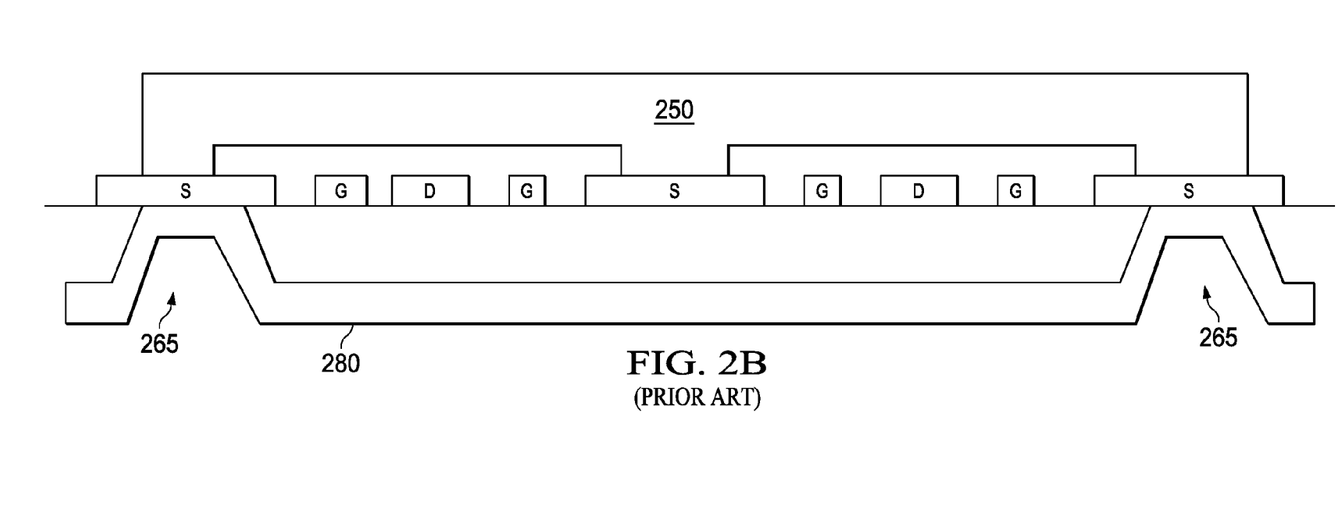

Another gallium arsenide field-effect transistor is described by R. Williams at pp. 66-67 of "Modern GaAs Processing Methods," which is configured with source and drain contacts on opposing sides of the die and a lateral channel, and is illustrated with respect to FIG. 2B. The gallium arsenide field-effect transistor includes a plated air bridge 250 coupled to a source (generally designated "S") on an upper side of the die. Gates (generally designated "G") are interposed between drains (generally designated "D"), and are also located on the upper surface of the die. Couplings to the source are brought down to a lower surface of the die by vias 265 that are plated-through holes between the lower surface and the source and are further coupled together by a plated heat sink 280. Although this arrangement can provide low-inductance external connections to the source, it is limited in its ability to provide a low-resistance channel tightly coupled to the lower surface of a highly conductive substrate.

The aforementioned design also does not accommodate large drain contacts desirable for a higher power device, which will increase the resistive and inductive losses. This configuration requires a complex air-bridge processing step, which will increase the cost and potentially affect the reliability of the device. For the large gate width field-effect transistor, the parasitic resistance in series with the source will increase due to the long air-bridge connection. This design also is incompatible with today's packaging techniques for higher power devices embodied in a vertical device configuration.

Additionally, U.S. Pat. No. 6,309,918 entitled "Manufacturable GaAs VFET Process," by Huang, et al., issued on Oct. 30, 2001, is directed toward a vertical FET with source and drain contacts on opposing sides of a die. U.S. Pat. No. 5,956,578 entitled "Method of Fabricating Vertical FET with Schottky Diode," by Weitzel, et al., issued on Sep. 21, 1999, and U.S. Pat. No. 6,097,046 entitled "Vertical Field Effect Transistor and Diode," by Plumton, issued on Aug. 1, 2000, are directed toward a vertical FET on a compound semiconductor substrate with an integrated Schottky diode on an upper surface of the die. None of the aforementioned references, which are also incorporated herein by reference, provides low on-resistance using a conductivity-enhanced lateral channel.

Still further references such as U.S. Pat. No. 5,068,756 entitled "Integrated Circuit Composed of Group III-V Compound Field Effect and Bipolar Semiconductors," by Morris, et al., issued on Nov. 26, 1991, and U.S. Pat. No. 5,223,449 entitled "Method of Making an Integrated Circuit Composed of Group III-V Compound Field Effect and Bipolar Semiconductors," by Morris, et al., issued on Jun. 29, 1993, which are incorporated herein by reference, describe an integration of multiple semiconductor devices on a die including n- and p-channel junction field-effect transistors with a lateral channel. These devices include an isolation trench surrounding the devices, etched to a lower semi-insulating gallium arsenide layer and backfilled with silicon nitride. The aforementioned devices, however, are configured with contacts on a top surface, which restricts their application from low voltage, high current systems wherein efficiency is an important design element.

Low on-resistance compound semiconductor field-effect transistors have been enhanced by the use of a layering structure called modulation doping as described in "Fundamentals of III-V Devices" by W. Liu (p. 323) and "Ultra-High Speed Modulation-Doped Field-Effect Transistors: A Tutorial Review," L. D. Nguyen, et al., Proceedings of the IEEE, Vol. 80, No. 4, pp. 494-518 (April 1992), which are incorporated herein by reference and are particularly applicable to devices with a lateral channel. The objective of modulation doping is to avoid electron scattering in the current conducting channel by ionized impurities due to dopants, which increases channel resistivity due to the decreased carrier mobility. Channel conductivity may be modulated by a separate control element such as a gate that controls channel depletion.

The modulation doping technique has been developed for lateral channels using, for instance, gallium arsenide as an undoped, narrower band gap channel and including an adjacent, doped, wider band gap layer of aluminum gallium arsenide, which provides an abundant and controllable source of free carriers to the gallium arsenide channel. Other combinations of compound semiconductors can be used such as an undoped indium gallium arsenide channel and an adjacent, doped aluminum gallium arsenide layer as the source of free carriers. Successful and repeatable applications of modulation doping, which is based on precision formation of a pseudomorphic layer, employs lateral channel arrangements that are not presently available in devices configured with vertical channels.

Considering the limitations as described above, a field-effect transistor design is not presently available for the more severe applications that lie ahead. Accordingly, what is needed in the art is a gallium arsenide and other compound semiconductor devices configured for wide acceptance, particularly in low voltage and high current applications, overcoming many of the aforementioned limitations. In accordance therewith, a compact and efficient power supply, particularly for low voltage and high current loads such as microprocessors, as well as amplifiers for telecommunications and other applications, would benefit from a robust field-effect transistor without incurring unnecessary costs or the need to commit a substantial portion of the physical volume of the end device to the power supply. A robust field-effect transistor would be very beneficial for high current and high power applications in the microwave regime (e.g., a microwave power amplifier), particularly at frequencies below 10 GHz.

SUMMARY OF THE INVENTION

These and other problems are generally solved or circumvented, and technical advantages are generally achieved, by advantageous embodiments of the present invention which includes a substrate driven field-effect transistor (FET) and a method of forming the same.

In one embodiment, the substrate driven FET includes a substrate having a source contact covering a substantial portion of a bottom surface thereof and a lateral channel above the substrate. The substrate driven FET also includes a drain contact above the lateral channel. The substrate driven FET still further includes a source interconnect for connecting the lateral channel to the substrate operable to provide a low resistance coupling between the source contact and the lateral channel.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a substrate driven field-effect transistor (FET). A substrate driven FET is configured with a source contact coupled to a substrate and a drain contact coupled to an opposing surface of the device to provide a low on-resistance switch with very fast switching transition times. The substrate driven FET also includes a lateral channel. The principles of the present invention may be applied to a compound semiconductor FET with a modulation-doped lateral channel and other semiconductor devices that include current-carrying, switched terminals on opposing surfaces thereof.

Exemplary characteristics and advantages associated with the use of selected embodiments of the substrate driven FET according to the principles of the present invention are set forth below. The substrate driven FET may be capable of switching transition times on the order of nanoseconds rather than switching transition times on the order of 35 to 50 nanoseconds realizable with the present silicon-based technology. The substrate driven FET may exhibit peak inverse voltage ratings such as 10 to 20 volts or less and should have low on-resistance including the parasitic electrical resistance from the device packaging approaching one milliohm or less. In addition, the substrate driven FET desirably has gates that can be driven with digital logic, with low gate charge and correspondingly low and controllable field-effect transistor threshold voltage. The substrate driven FET also desirably has current ratings of at least a dozen amperes, and should be cost competitive with presently available field-effect transistors having similar power ratings implemented in silicon-based technology. Additionally, the substrate driven FET has source and drain contacts on opposing sides of the die that facilitates low resistance and inductance packaging by providing more area for the contacts.

In the drawings, boundaries may be shown as lines to separate semiconductor regions or layers with apparent abrupt changes in doping levels or species. It is recognized that semiconductor manufacturing processes such as ion implantation and diffusion may cause doping concentrations and atomic species to vary in a continuous and sometimes gradual manner across a semiconductor device. Consequently, graded boundaries of device regions may be shown as lines in the drawings for explanatory purposes without compromising an understanding of the structure of the devices.

Many steps conventionally used to process a gallium arsenide (also referred to as "GaAs") die or wafer and other compound semiconductors as described herein are well known in the art, and, in the interest of brevity, will not be described in detail. The basic steps include, for example, molecular-beam epitaxy, metal-organic chemical vapor deposition, patterning, exposing, etching, vacuum depositing, plating, doping, alloying, annealing, and cleaning. For reference purposes, R. Williams describes many conventional processes for constructing a gallium arsenide device in "Modern GaAs Processing Methods." Additionally, several separate processing steps may be generally combined into a single step within the scope of the present invention, such as a combined annealing step wherein a number of alloys that are separately deposited are heated together to jointly activate the alloys. Further, alternative methods to perform a processing step such as vacuum deposition, sputtering, or plating processes may be combined or performed separately without further elaboration herein.

Figure 3:
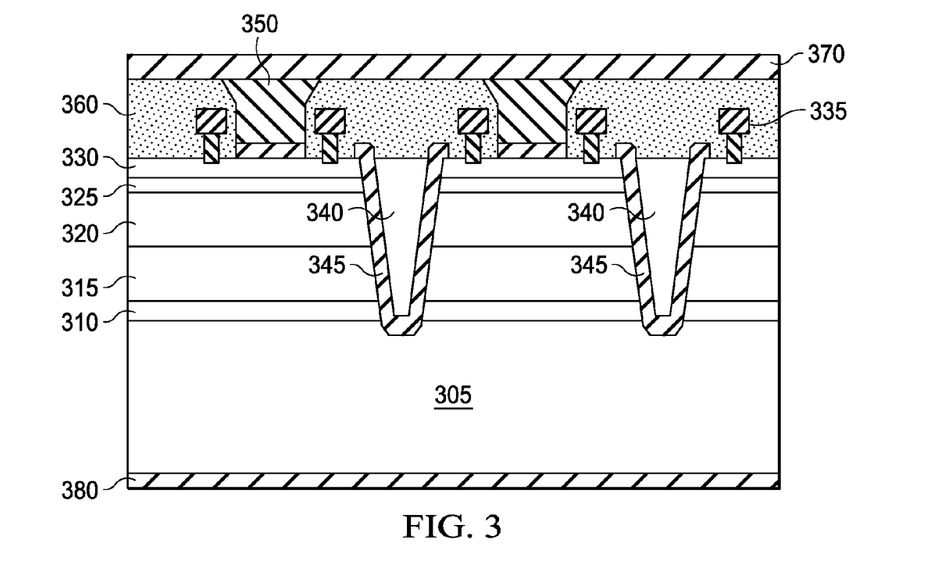
FIG. 3 illustrates a cross sectional view of an embodiment of a semiconductor device according to the principles of the present invention.

Referring now to FIG. 3, illustrated is a cross sectional view of an embodiment of a semiconductor device (e.g. substrate driven FET) according to the principles of the present invention. As illustrated in FIG. 3, the substrate driven FET is formed on a conductive substrate (e.g., GaAs substrate) 305. The substrate 305 may be chosen to be sufficiently thick to provide mechanical and chemical support for semiconductor processing and handling, and may be supported by a further underlying medium. The substrate 305 provides a source connection for the substrate driven FET, accommodating a low-resistance connection over a substantial portion of the lower surface thereof.

The substrate 305 is preferably n+ doped and a preferred n-type doping element for GaAs is silicon ("Si"), but selenium ("Se"), tellurium ("Te") or other doping materials or combinations thereof may be employed within the broad scope of the present invention. Although the substrate driven FET described herein is GaAs based, alternative semiconductor materials may be employed to form the substrate 305 such as a semiconductor material based on indium-phosphide ("InP") as well as oppositely doped semiconductors with essential properties of related materials appropriately altered. The crystal axes of the substrate 305 may be aligned with the principal axes of the FIG. 3 or may be tilted slightly such as two degrees to produce a smoother surface for further crystal growth.

Above the substrate 305 is a first buffer layer (e.g., an n+ epitaxial buffer layer) 310 that is preferably grown via molecular beam epitaxy or metal-organic chemical-vapor deposition. A suitable n-type doping element such as Si may be employed, but alternatively Se, Te or other n-type dopant or combination thereof may be employed in the epitaxial growth process. The addition of the first buffer layer 310 generally provides a more uniform crystal structure for further epitaxial depositions than an ordinary, doped GaAs substrate 305, and thus may be optionally included in the formation of the substrate driven FET for improved device characteristics.

Above the first buffer layer 310 is an isolation layer (e.g., a p-doped isolation layer) 315 that is epitaxially grown and formed sufficiently thin to avoid leakage between a drain contact and the substrate 305. The isolation layer 315 is preferably connected to the source potential. Connecting the isolation layer 315 to a source will allow any charge buildup in the p-doped isolation layer to leak off, substantially avoiding any change in potential of the isolation layer 315. Electrical connection to a source contact may be obtained along the interface for the first buffer and isolation layers 310, 315 (via tunneling or a leaky junction) or it may be engineering in the region of the metallization, if the metal makes a quasi-ohmic contact to the isolation layer 315. The isolation layer 315, therefore, is oppositely doped from or is a layer having an opposite carrier type from the substrate 305 and provides substantial electrical isolation between the substrate 305 and a lateral channel thereabove.

Above the isolation layer 315 is a second buffer layer 320 which may be provided to enhance the performance of the substrate driven FET, such as sustaining a high drain-to-source voltage (e.g., 20 volts) when the substrate driven FET is in a non-conducting state. The second buffer layer 320, which may be undoped, also provides support for a lateral channel formed thereover.

Above the second buffer layer 320 is a lateral channel 325 that is epitaxially deposited to form a lateral channel with controllable conductivity. Inasmuch as a lattice mismatch may exist between the channel layer 325 and the second buffer layer 320, the lateral channel 325 may be inherently lattice-strained (ie., it is "pseudomorphic") and is preferably formed thin enough to prevent lattice dislocations and formation of polycrystalline structure in the layer(s) to be deposited thereabove. The lateral channel 325 may provide higher carrier mobility owing to a reduced effective mass of the carriers. The lateral channel 325 provides the controllable conduction mechanism between the source and drain contacts of the substrate driven FET.

Above the lateral channel 325 is a barrier region 330 that is preferably epitaxially deposited with aluminum-gallium arsenide (AlGaAs) to provide additional free carriers (electrons) for modulation doping of the lateral channel 325, and to provide a barrier for the free carriers in the lateral channel 325. A gate (e.g., a plurality of gate fingers and one of which is designated 335) is formed over the barrier region 330, wherein the gate is used to control the conductivity of lateral channel 325, thereby controlling current conduction between the source and drain contacts of the substrate driven FET.

A source via (e.g., a source trench 340) is etched through the barrier region 330, lateral channel 325, isolation layer 315, and the first and second buffer layers 310, 320 to the substrate 305 to form a source interconnect within the substrate driven FET. The walls of the source trench may be sufficiently sloped so that a thin metal layer (generally designated 345) can be deposited on horizontal and semi-horizontal surfaces, preferably by a vacuum evaporation and deposition process. The metallized sidewalls 345 of the source trench 340 are designed to further enhance ohmic contacts for the source interconnect to connect the source trench 340 to the lateral channel 325 and the substrate 305, thereby providing a low resistance connection between the source (embodied in the lateral channel 325) and the substrate 305.

Drain posts or fingers 350 of the FET are thereafter formed above the barrier region 330 to extend a connection for the drain (embodied in the lateral channel 325) to a top surface of the substrate driven FET. A dielectric layer 360 may then be formed about the substrate driven FET, preferably with a low dielectric constant material (e.g. BCB, polyimide, Si glass, or other flowable oxide) to preserve a performance of the substrate driven FET. The dielectric layer 360 is typically spun on and cured as necessary for planarization and for further surface passivation. The thickness of the dielectric layer 360 can be controlled by a spinning speed and duration. The cured dielectric layer 360 is strong enough to provide mechanical and chemical support for subsequent processing steps.

Metallized top and bottom contacts (also referred to as drain and source contacts 370, 380, respectively) coupled to the drain post 350 and substrate 305, respectively, are sequentially deposited and preferably patterned on the top and bottom surfaces, respectively, of the substrate driven FET. The drain contact 370 interconnects the drain posts 350, and may preferably occupy most of the surface area, since there may be little or no source metal that might interfere with the drain interconnects. The drain post 350 can possibly be used to bond the drain to the package directly over the device itself, to further save area by eliminating the need for bond pads. The source contact 380 is on a bottom surface of the substrate 305.

Figure 4:
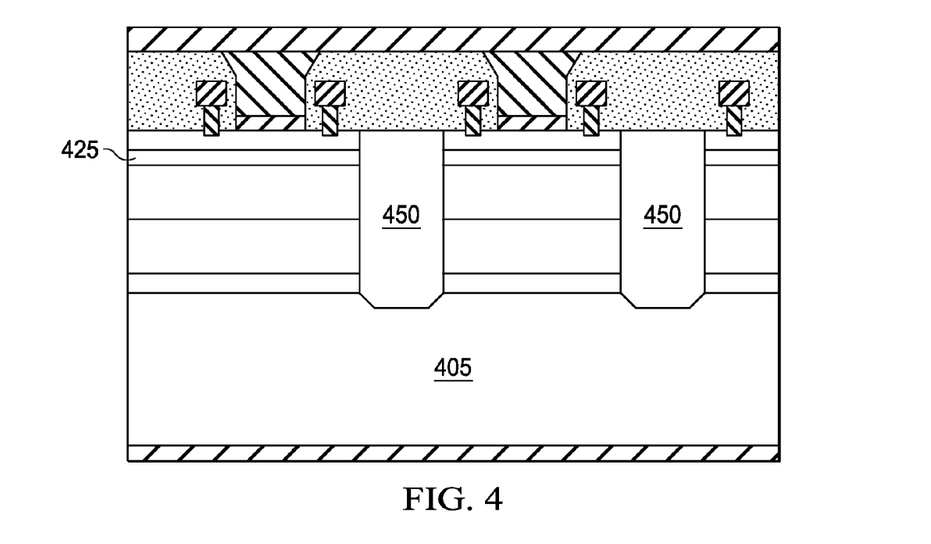
FIG. 4 illustrates a cross sectional view of an embodiment of a semiconductor device according to the principles of the present invention.

Referring now to FIG. 4, illustrated is a cross sectional view of an embodiment of a semiconductor device (e.g. substrate driven FET) according to the principles of the present invention. The structure of the substrate driven FET illustrated in FIG. 4 is substantially similar to the substrate driven FET illustrated in FIG. 3, with the exception of implant regions (e.g., n+ doped implant regions) 450 form a source interconnect within the substrate driven FET. In the embodiment of FIG. 4, the implant regions 450 provide connection between a lateral channel 425 and a substrate 405, thereby providing a low resistance connection between a source contact and the lateral channel 425. The implant regions 450 may be used in place of the source via 340 illustrated and described with respect to FIG. 3, perhaps as a process simplification or a cost reduction, among other advantages, to form the source interconnect.

Figure 5:
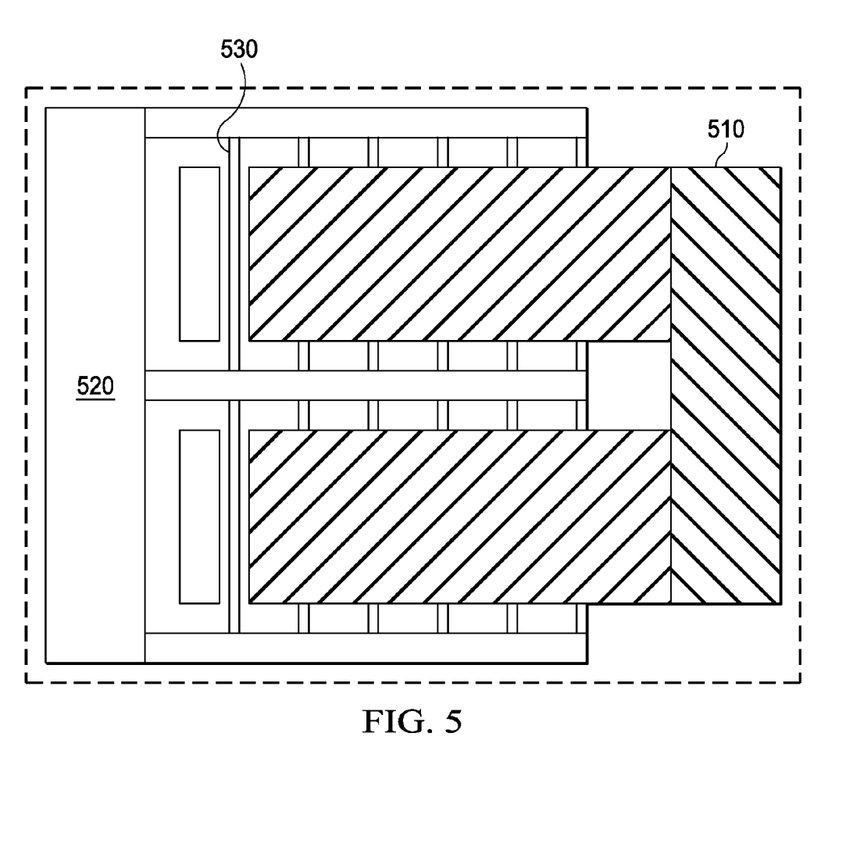
FIG. 5 illustrates a top plan view of an embodiment of a semiconductor device according to the principles of the present invention.

Turning now to FIG. 5, illustrated is a plan view of another embodiment of a semiconductor device (e.g., substrate driven FET) constructed according to the principles of the present invention. A drain contact 510 of the substrate driven FET provides a wide area surface covering a substantial portion of the die area, enabling a low-resistance contact to the drain. A gate contact 520 with gate extensions 530 contacts a gate of the substrate driven FET. The couplings (not shown) between the gate extensions 530 on a top surface of the die and the gate may be made by plated vias through a dielectric layer using well understood masking, patterning, etching and deposition processes. For a more detailed explanation of an embodiment of the drain contact, gate, and dielectric layer, see the description of the substrate driven FET as provided with respect to FIG. 3, et seq. A metallized source contact (not shown) preferably covers substantially an entire area of the opposing die surface. Thus, the substrate driven FET with reduced area and low on-resistance is enabled by the device structure and methods of the present invention.

Figure 6:
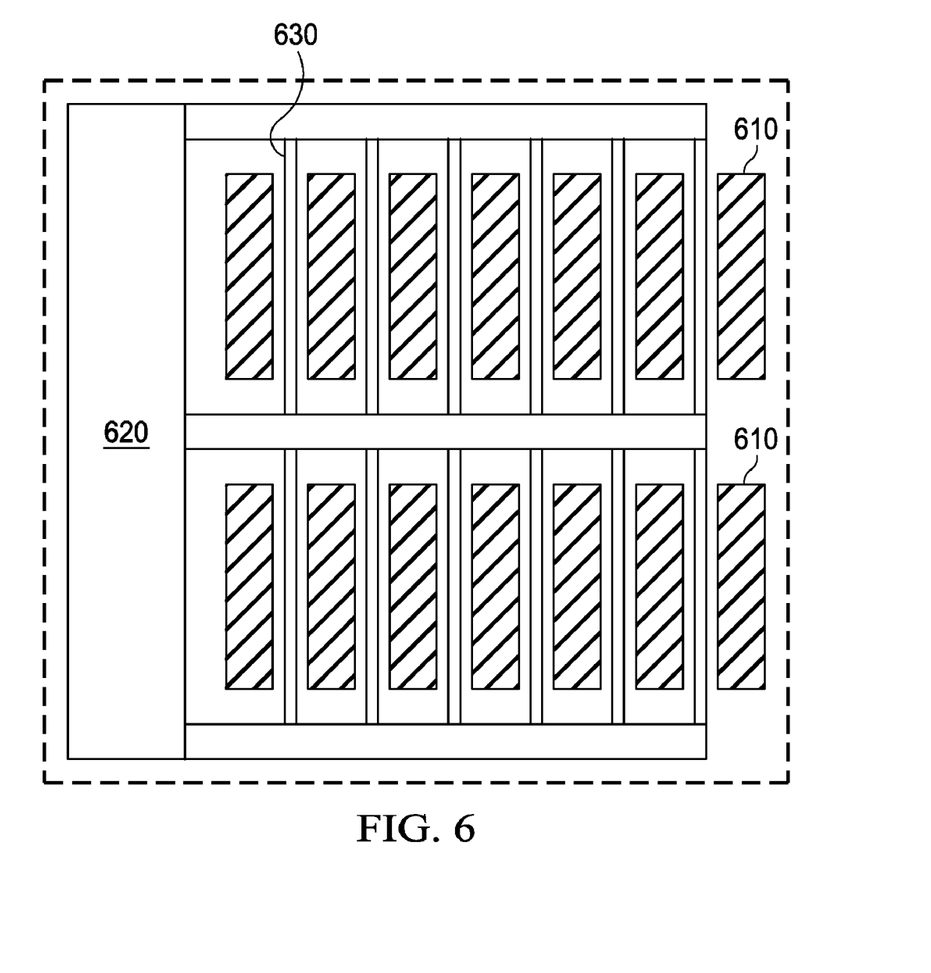
FIG. 6 illustrates a top plan view of an embodiment of a semiconductor device according to the principles of the present invention.

Turning now to FIG. 6, illustrated is a plan view of another embodiment of a semiconductor device (e.g., substrate driven FET) constructed according to the principles of the present invention. A plurality of drain contacts 610 of the substrate driven FET provide multiple drain contacts covering a substantial portion of the die area, enabling a low-resistance contact to the drain. A gate contact 620 with gate extensions 630 contacts a gate of the substrate driven FET. The couplings (not shown) between the gate extensions 630 on a top surface of the die and the gate may be made by plated vias through a dielectric layer using well understood masking, patterning, etching and deposition processes. For a more detailed explanation of an embodiment of the drain contact, gate, and dielectric layer, see the description of the substrate driven FET as provided with respect to FIG. 3, et seq. In the embodiment of FIG. 6, wire bond wires, solder bumps, or alternative connection techniques may be employed to interconnect the drain contacts 610 to a package or an electronic circuit board, for example. A metallized source contact (not shown) preferably covers substantially an entire area of the opposing die surface. Thus, the substrate driven FET with reduced area and low on-resistance is enabled by the device structure and methods of the present invention.

Thus, a new physical structure for an III-V field-effect transistor [such as a GaAs— or InP-based metal extrinsic semiconductor field-effect transistor (MESFET), high electron mobility transistor (HEMT) or pseudomorphic high electron mobility transistor (pHEMT)] is proposed, in which there are many source fingers, trenches, or contacts, all of which are connected to a common substrate. The substrate connection permits electrical contact in a compact way, with low resistance and low inductance. The structure simplifies the wiring requirements for high current FETs, and allows a smaller die area to be used to achieve a desired amount of FET current. The structure also simplifies the metallization procedure for interconnecting the drain contacts. The structure may preferably make use of a p-type region separating the n-substrate from the FET channel and drain, to reduce leakage currents. The structure can also make use of bonding for the drain connection directly to the region on top of the devices, thereby possibly eliminating the need for a separate pad area. The resulting substrate driven FET can be designed and packaged to exhibit very low on-resistance and be operable with very fast switching speeds.

In present III-V FETs, the substrate is typically semi-insulating, and there is a layer of metallization on the wafer surface to connect to the source regions. This leads to a relatively large die layout area, and tends to increase cost, decrease yield and increase source inductance. These problems are circumvented with the substrate driven FET according to the principles of the present invention. The FETs used to carry substantial amounts of current, such as devices for power switching and for power amplifiers, at present have many fingers, with a gate-to-gate spacing typically of 10-12 microns. With the proposed structure, smaller gate-to-gate spacing may be achieved, potentially down to 5 microns. The reduced spacing may permit a substantial reduction in the die area.

The structure can be used for high current/high power applications of FETs, particularly at frequencies below 10 GHz. For example, the structure is well suited to switches for power converters. It is also potentially useful for transistors employed in microwave power amplifiers. These structures typically require very large equivalent gate widths, and thus require many fingers to be interconnected. The present invention may potentially make the devices less expensive to manufacture, owing to a reduced die size.

Those skilled in the art should understand that the previously described embodiments of the field-effect transistor and related methods of forming the same are submitted for illustrative purposes only. In addition, other embodiments capable of providing the advantages as described above are well within the broad scope of the present invention. While the field-effect transistor has been described as providing advantages in the environment of a power supply, other applications therefore are well within the broad scope of the present invention.

For a better understanding of power electronics, see "Principles of Power Electronics," by J. G. Kassakian, M. F. Schlecht and G. C. Verghese, Addison-Wesley (1991). For a better understanding of semiconductor devices and processes, see "Fundamentals of III-V Devices," by William Liu, John Wiley and Sons and of gallium arsenide processing, see "Modern GaAs Processing Methods," by Ralph Williams, Artech House, Second Ed. (1990). The aforementioned references are incorporated herein by reference.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof, to form the devices providing reduced on-resistance, gate drive energy, and costs as described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. Additionally, the terms "above," "formed over" or other similar terminology employed in reference to the semiconductor device or method of forming the same shall not be limited to "directly above" or "directly formed over" and, unless otherwise specified, the scope of the present invention contemplates that intervening layers may be present when characterizing a layer above, over, formed over, etc. another layer.

What is claimed is:

1. A substrate driven field effect transistor (FET), comprising:
   a conductive substrate having a source contact covering a substantial portion of a bottom surface thereof;
   a first buffer layer above and formed from a similar material to said conductive substrate;
   an isolation layer above said first buffer layer;
   a second buffer layer above said isolation layer;
   a lateral channel above said second buffer layer and formed from a similar material to said conductive substrate;
   a drain contact above said lateral channel and formed on a top surface of said substrate driven FET; and
   a source interconnect formed through said lateral channel to, without penetrating through, said conductive substrate operable to provide a low resistance coupling between said source contact and said lateral channel.

2. The substrate driven FET as recited in claim 1 wherein said first buffer layer is an n+ epitaxial buffer layer.

3. The substrate driven FET as recited in claim 1 wherein said isolation layer is oppositely doped from said conductive substrate.

4. The substrate driven FET as recited in claim 1 wherein said lateral channel is pseudomorphic.

5. The substrate driven FET as recited in claim 1 further comprising a barrier region interposed between said lateral channel and said drain contact.

6. The substrate driven FET as recited in claim 1 further comprising a gate interposed between said lateral channel and said drain contact.

7. The substrate driven FET as recited in claim 1 wherein said source interconnect is formed from a group consisting of:
   a trench, and
   an implant region.

8. The substrate driven FET as recited in claim 1 further comprising a metal layer on sidewalls of said source interconnect.

9. The substrate driven FET as recited in claim 1 further comprising a drain post interposed between said lateral channel and said drain contact.

10. The substrate driven FET as recited in claim 1 further comprising a dielectric layer interposed between said lateral channel and said drain contact.

11. A method of forming a substrate driven field effect transistor (FET) on a conductive substrate, comprising:
    forming a first buffer layer with a similar material to and over said conductive substrate;
    forming an isolation layer over said first buffer layer;
    forming a second buffer over said isolation layer;
    forming a lateral channel with a similar material to said conductive substrate over said second buffer layer;
    forming a source interconnect through said lateral channel to, without penetrating through, said conductive substrate;
    forming a drain contact above said lateral channel on a top surface of said substrate driven FET; and
    forming a source contact over a substantial portion of a bottom surface of said conductive substrate, said source interconnect operable to provide a low resistance coupling between said source contact and said lateral channel.

12. The method as recited in claim 11 wherein said first buffer layer is an n+ epitaxial buffer layer.

13. The method as recited in claim 11 wherein said isolation layer is oppositely doped from said conductive substrate.

14. The method as recited in claim 11 wherein said lateral channel is pseudomorphic.

15. The method as recited in claim 11 further comprising forming a barrier region over said lateral channel.

16. The method as recited in claim 11 further comprising forming a gate over said lateral channel.

17. The method as recited in claim 11 wherein said source interconnect is formed from a group consisting of:
    a trench, and
    an implant region.

18. The method as recited in claim 11 further comprising forming a metal layer on sidewalls of said source interconnect.

19. The method as recited in claim 11 further comprising forming a drain post over said lateral channel.

20. The method as recited in claim 11 further comprising forming a dielectric layer over said lateral channel.

* * * * *